(12) United States Patent
Ando et al.

(10) Patent No.: US 7,362,098 B2
(45) Date of Patent: Apr. 22, 2008

(54) MAGNETIC FIELD SENSOR

(75) Inventors: Noriaki Ando, Tokyo (JP); Norio Masuda, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 10/599,365

(22) PCT Filed: Mar. 30, 2005

(86) PCT No.: PCT/JP2005/006073

§ 371 (c)(1),
(2), (4) Date: Sep. 26, 2006

(87) PCT Pub. No.: WO2005/096007

PCT Pub. Date: Oct. 13, 2007

(65) Prior Publication Data
US 2007/0216408 A1    Sep. 20, 2007

(30) Foreign Application Priority Data
Mar. 31, 2004    (JP)    ............................. 2004-106521

(51) Int. Cl.
*G01R 33/00*    (2006.01)
*G01R 33/02*    (2006.01)
*G01B 7/00*    (2006.01)
*H01F 5/04*    (2006.01)

(52) U.S. Cl. ...................... 324/258; 324/252; 324/249; 324/244; 336/200; 361/763; 361/772; 361/777

(58) Field of Classification Search ................ 324/244, 324/249, 252, 258, 260; 336/200; 361/763, 361/772, 777
See application file for complete search history.

(56) References Cited

U.S. PATENT DOCUMENTS 3,504,276 A * 3/1970 Beaver et al. .............. 324/260
7,046,113 B1 * 5/2006 Okamoto et al. .......... 336/200

FOREIGN PATENT DOCUMENTS

| JP | 10-082845 A | 3/1998 |
|---|---|---|
| JP | 2000-055994 A | 2/2000 |
| JP | 2000-121712 A | 4/2000 |
| JP | 2000-147034 A | 5/2000 |
| JP | 2000-171535 A | 6/2000 |
| JP | 2003-207531 A | 7/2003 |

* cited by examiner

*Primary Examiner*—Bot LeDynh
(74) *Attorney, Agent, or Firm*—Hayes Soloway P.C.

(57) ABSTRACT

Two coil forming elements (12, 14) formed of conductor layers and a contact means (19), which is formed in an interlayer dielectric film (13) interposed between the conductor layers and brings the upper and lower coil forming elements into contact with each other through a via hole form a stacked coil (10). One end of the stacked coil is connected to an upper grounding layer (27) of a strip line (20), and the other end of the stacked coil is connected to a strip conductor (23) of the strip line. The number of turns of the stacked coil is larger than 1. A magnetic flux penetrating through the stacked coil increases to be able to induce a relatively large electromotive force. Thus, a high spatial resolution can be obtained easily.

18 Claims, 12 Drawing Sheets

MAGNETIC FIELD SENSOR

This is a 371 national phase application of PCT/JP05/06073, filed Mar. 30, 2005, which claims priority to Japanese Patent Application No. 2004-106521, filed Mar. 31 2004, the contents of which are incorporated herein by reference.

TECHNICAL FIELD

The present invention relates to a magnetic field sensor and, more particularly, to a magnetic field sensor which can detect a high-frequency magnetic field by detecting an electromagnetically induced electromotive force.

BACKGROUND ART

Today, the performance and functions in electronic devices improve rapidly. Accordingly, the electromagnetic waves emitted from individual electronic devices or electronic circuits strengthen. When an electronic device or electronic circuit emits strong electromagnetic waves, the electromagnetic waves may cause a surrounding electronic device or electronic circuit to operate erroneously.

As one of factors that cause emission of strong electromagnetic waves, an unwanted high-frequency current flowing through the circuit, particularly a high-frequency noise current flowing through the power supply wiring line of a semiconductor device, is known. To suppress the high-frequency noise current by design or at an early stage of the manufacture is sought for.

Measurement of a magnetic near-field intensity allows to specify the path of the high-frequency noise current by non-contact inspection. This enables verification of the effect of suppressing the high-frequency noise current at an early stage of design or the manufacture, making it possible to take measures against electromagnetic waves. As sensors of a type that detect a magnetic field by measuring an electromotive force induced in a coil, for example, the following sensors are known.

According to the structure of the magnetic field sensor described in Japanese Patent Laid-Open No. 10-82845 (reference 1), each of a pair of dielectric wiring substrates having C-shapes is provided with a ground conductor having such a shape and size that it overlaps the corresponding dielectric wiring substrate when seen from the top. The pair of dielectric wiring substrates sandwich a strip conductor having a predetermined shape. A voltage induced between the starting end position of the strip conductor and each ground conductor is detected as a magnetic field detection output.

The dielectric wiring substrates in this magnetic field sensor are arranged to oppose each other such that the ground conductors are exposed on their outer surfaces. The strip conductor electrically connects to the respective ground conductors at the terminal end position of the strip conductor. Each ground conductor serves to shield the strip conductor from the external electric field. The terminal end position of the strip conductor is located on one of those two ends of the dielectric wiring substrates which oppose each other through a gap (a notch that forms a C shape). The strip conductor extends from the terminal end position across the gap along one of the C-shaped semicircular peripheral portions of the dielectric substrates, and starts at a predetermined position on the semicircular peripheral portion.

According to the structure of the magnetic field sensor described in Japanese Patent Laid-Open No. 2000-171535 (reference 2), the first, second, and third layers respectively having conductor patterns with predetermined shapes are stacked such that insulating layers are interposed between the respective layers and that the conductor pattern of the second layer connects to the conductor patterns of the first and third layers. A voltage generated in a load connected between the conductor pattern of the second layer and the conductor pattern of the first layer, and a voltage generated in a load connected between the conductor pattern of the second layer and the conductor pattern of the third layer are detected as a magnetic field output. In this magnetic field sensor, the shape of each conductor pattern is so selected as to form a 1-turn loop coil when the conductor pattern is seen from the top. The conductor patterns of the first and third layers serve to shield the conductor pattern of the second layer from the external electric field.

According to the structure of the pen type magnetic near-field probe described in Japanese Patent Laid-Open No. 2000-121712 (reference 3), a printed wiring board (support) having a fine loop coil, transmission line, and high-frequency cable connecting portion connects to the distal end of a retainer.

In the tightly fixed magnetic near-field probe described in Japanese Patent Laid-Open No. 2000-147034 (reference 4), a 1-turn loop coil, coplanar transmission line, and high-frequency connector are arranged on a sheet-like substrate. A releasable adhesion surface is formed on the rear surface of the substrate, or an engaging portion engageable with a wire is formed on the substrate. Thus, the probe can be adhered to and released from a measurement target.

According to the structure of the magnetic near-field probe described in Japanese Patent Laid-Open No. 2003-207531 (reference 5), a 1-turn loop coil and a transmission circuit connecting to it are provided to a dielectric. The impedance of the transmission circuit is gradually changed in the transmission direction to suppress a decrease in output voltage.

DISCLOSURE OF INVENTION

Problem to be Solved by the Invention

For example, the feature sizes of semiconductor integrated circuits decrease every year. To specify the path of a high-frequency noise current flowing through a fine electronic circuit and to evaluate the current value flowing through individual wiring line, the spatial resolution of the magnetic field sensor must be improved.

Any of the sensors described in references 1 to 5 detects a magnetic field on the basis of an electromotive force induced in a 1-turn loop coil. If the loop coil is made smaller, the magnetic flux penetrating through the loop coil decreases to degrade the detection sensitivity. The loop coil having this structure is difficult to be made small while maintaining a practical detection sensitivity. Consequently, it is difficult to improve the spatial resolution of the sensor.

In the magnetic field sensor described in reference 1, the line widths of the ground conductors to shield the strip conductor from the external electric field must be larger than the line width of the strip conductor. This magnetic field sensor cannot decrease the shortest distance with respect to an inspection target object, when specifying a place where electromagnetic waves are generated, to be smaller than the shortest distance between the terminal end position of the strip conductor when the ground conductors are seen from the above and the outer surfaces of the ground conductors. In this respect as well, in the magnetic field sensor described in reference 1, the spatial resolution is difficult to increase. The same applies to the magnetic field sensor described in reference 2.

The present invention has been made in view of the above situations, and has as its object to provide a magnetic field sensor that can achieve a high spatial resolution easily.

Means of Solution to the Problem

In order to achieve the above object, according to the present invention, there is provided a magnetic field sensor characterized by comprising a substrate, a stacked coil formed on the substrate, and a strip line formed on the substrate to continue to the stacked coil, wherein the stacked coil comprises coil forming elements respectively formed of at least two conductor layers on the substrate, and contact means, formed in an interlayer dielectric film interposed between the conductor layers, for bringing the coil forming elements on and under the interlayer dielectric film into contact with each other through a via hole, the strip line comprises a structure in which a lower grounding layer, a lower interlayer dielectric film, a strip conductor, an upper interlayer dielectric film, and an upper grounding layer are stacked on the substrate in an order named, the number of turns of the stacked coil is larger than 1, one end of the stacked coil continues to either one grounding layer of the lower grounding layer and the upper grounding layer, and the other end of the stacked coil continues to the strip conductor.

EFFECTS OF THE INVENTION

In the magnetic field sensor according to the present invention, as the number of turns of the stacked coil is larger than 1, the magnetic flux penetrating through the stacked coil increases to be able to induce a comparatively large electromotive force. Hence, even when the stacked coil is downsized, a high detection sensitivity can be maintained. The shape and size of the stacked coil can be easily designed such that the stacked coil can be easily set close to the measurement target object. Therefore, with the magnetic field sensor of the present invention, a high spatial resolution can be achieved easily. As a result, the magnetic field sensor can measure, for example, a high-frequency noise current flowing through a fine electronic circuit easily, and accordingly measures against electromagnetic waves can be easily taken at an early stage of design or the manufacture of an electronic device or electronic circuit.

BEST MODE FOR CARRYING OUT THE INVENTION

First Embodiment

Figure 1:
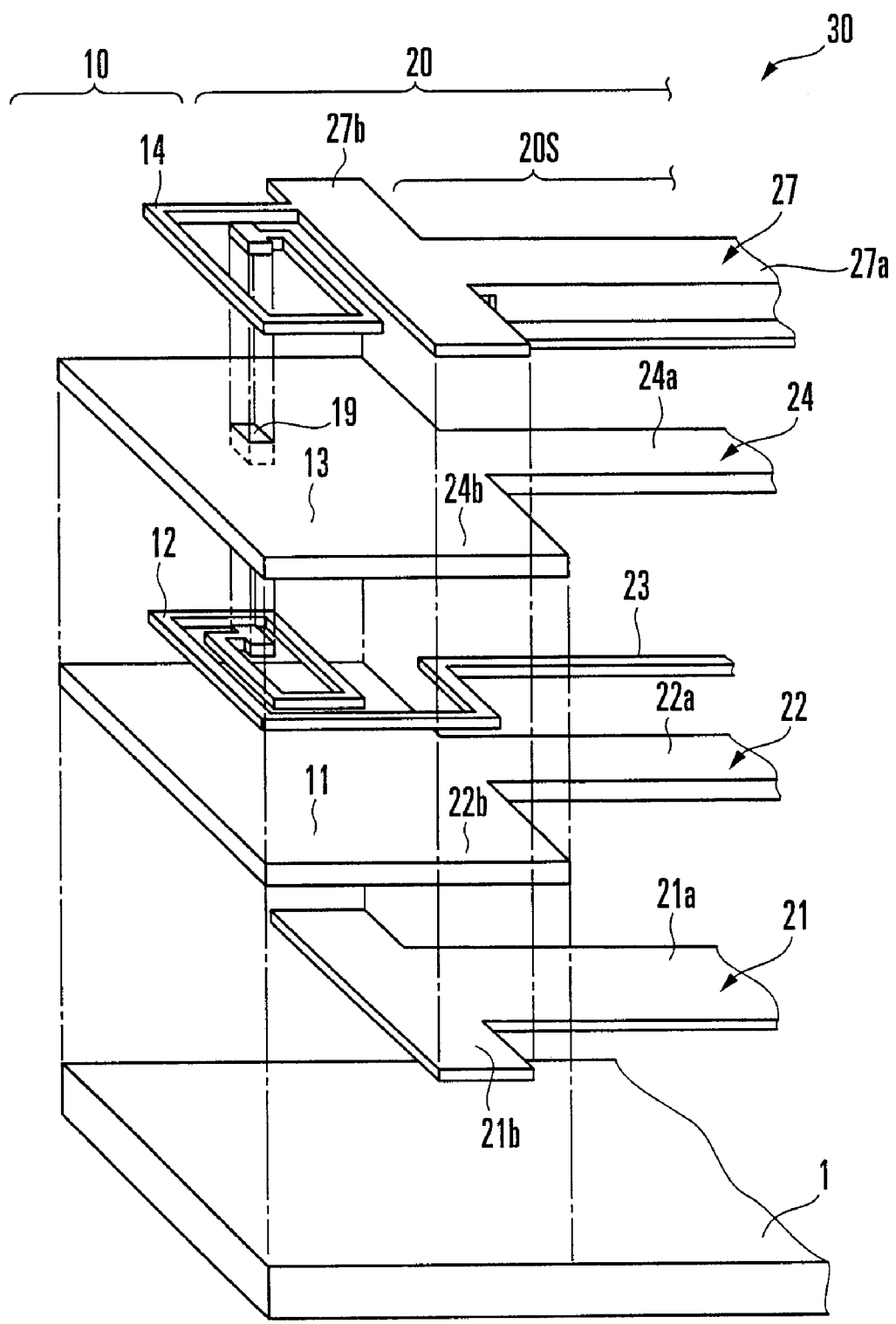
FIG. 1 is an exploded perspective view schematically showing a magnetic field sensor according to the first embodiment of the present invention.

As shown in FIG. 1, a magnetic field sensor 30 according to the first embodiment of the present invention has a substrate 1, a stacked coil 10 formed on the substrate 1, and a strip line 20 formed on the substrate 1 to continue to the stacked coil 10.

The stacked coil 10 has a structure in which a coil portion first interlayer dielectric film 11, first coil forming element 12, coil portion second interlayer dielectric film 13, and second coil forming element 14 are stacked on the substrate 1 in the order named. The coil portion second interlayer dielectric film 13 has a contact plug (contact means) 19 which brings the first coil forming element 12 and second coil forming element 14 into contact with each other through a via hole.

The strip line 20 has a structure in which a lower grounding layer 21, line portion first interlayer dielectric film 22, strip conductor 23, line portion second interlayer dielectric film 24, and upper grounding layer 27 are stacked on the substrate 1 in the order named.

The substrate 1, stacked coil 10, and strip line 20 will be described in detail hereinafter with reference to FIG. 1 and FIGS. 2 to 6 to be referred to later.

(1) Substrate;

As the substrate 1, for example, an insulating substrate such as a glass substrate or sapphire substrate can be used. The thickness of the substrate 1 can be appropriately selected in the range of about 1 μm or less. When performing measurement on a semiconductor integrated circuit chip in an open package, from the viewpoint of preventing the magnetic field sensor 30 from abutting against an obstacle such as a bonding wire as much as possible, the substrate 1 is preferably formed as thin as possible.

(2) Stacked Coil;

As described above, the stacked coil 10 comprises a stacked body of the coil portion first interlayer dielectric film 11, first coil forming element 12, coil portion second interlayer dielectric film 13, and second coil forming element 14.

The coil portion first interlayer dielectric film 11 is formed on the substrate 1 and forms a flat surface to arrange the first coil forming element 12. The planar shape of the coil portion first interlayer dielectric film 11 is rectangular. The coil portion second interlayer dielectric film 13 is formed on the first coil forming element 12 and forms a flat surface to arrange the second coil forming element 14. The planar shape of the second coil forming element 14 is also rectangular.

Figure 2:
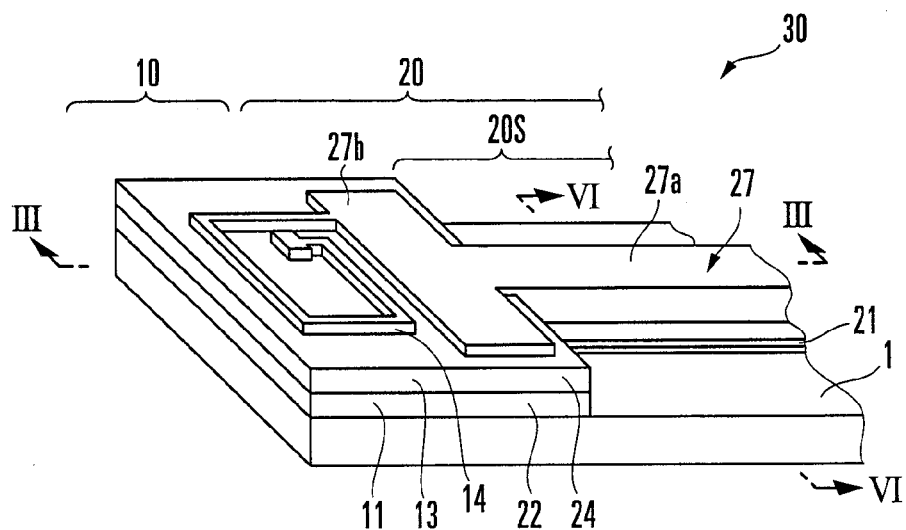
FIG. 2 is a perspective view schematically showing the magnetic field sensor shown in FIG. 1.
Figure 3:
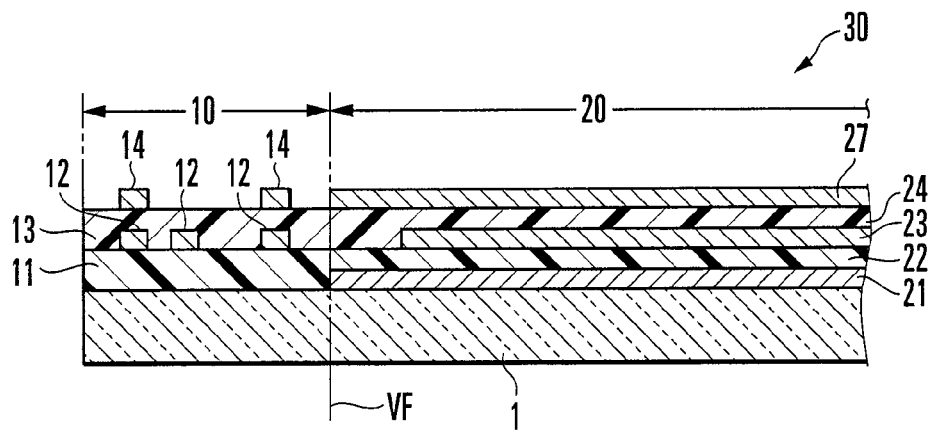
FIG. 3 is a schematic view of a section taken along the line III-III shown in FIG. 2.

As shown in FIGS. 2 and 3, the coil portion second interlayer dielectric film 13 covers the first coil forming element 12. The coil portion first interlayer dielectric film 11 and coil portion second interlayer dielectric film 13 overlap each other when seen from the top.

Each of the coil portion first interlayer dielectric film 11 and coil portion second interlayer dielectric film 13 can be fabricated by depositing a large-size electric insulating film using a photoresist, a silicon oxide, or the like as the material with a method such as spin coating or sputtering, and patterning the insulating film into a predetermined shape using a method such as etching. The thickness of each of the coil portion first interlayer dielectric film 11 and coil portion second interlayer dielectric film 13 can be appropriately selected within the range of about 0.5 μm to 3 μm.

The contact plug 19 (see FIG. 1) formed in the coil portion second interlayer dielectric film 13 is fabricated by forming a via hole (connection hole) in the coil portion second interlayer dielectric film 13 and filling the via hole with a conductive material such as copper or aluminum. To suppress the conductor resistance of the magnetic field sensor 30 low, it is preferable to form the contact plug 19 using a highly conductive material. The contact plug 19 connects the first coil forming element 12 and second coil forming element 14 to each other to bring them into contact with each other through the via hole.

The first coil forming element 12 and second coil forming element 14 connect to each other through the contact plug 19 to form a coil having a number of turns somewhat smaller than 3. With reference to the substrate 1, the first coil forming element 12 corresponds to the lowermost coil forming element, and the second coil forming element 14 corresponds to the uppermost coil forming element.

The number of turns of the first coil forming element 12 is somewhat smaller than 2, and the number of turns of the second coil forming element 14 is somewhat larger than 1. Each of the coil forming elements 12 and 14 can be fabricated by patterning a conductor layer, which is formed using a conductive material such as copper or aluminum with plating, a physical vapor deposition (PVD), chemical vapor deposition (CVD), or the like, into a predetermined shape by a method such as etching. To downsize the stacked coil 10 so as to improve the spatial resolution of the magnetic field sensor 30, it is preferable to fabricate each of the coil forming elements 12 and 14 using a highly conductive material such as copper or aluminum.

The thicknesses of the coil forming elements 12 and 14 can be appropriately selected within ranges of about 0.5 μm to 4 μm, and their line widths can be appropriately selected within ranges of about 1 μm to 4 μm. From the viewpoint of improving the spatial resolution of the magnetic field sensor 30, it is preferable to select the line widths of the coil forming elements 12 and 14 within ranges of about 1 μm to 2.5 μm.

From the same viewpoint, the outline shape of the stacked coil 10 when seen from the top preferably forms a rectangle with short sides each parallel to the longitudinal axis of the strip line 20. If the shape of the stacked coil 10 is selected in this manner, as compared to a case wherein the outline shape of the stacked coil 10 when seen from the top is circular, when the stacked coil 10 is set close to the measurement target object, the magnetic flux penetrating through the stacked coil 10 can be increased. As a result, even when the stacked coil 10 is downsized, the detection sensitivity of the magnetic field sensor 30 can be easily maintained high. When a magnetic field sensor 30 having a high spatial resolution is to be obtained, the size and shape of the outline of the stacked coil 10 when seen from the top are particularly preferably those of a rectangle in which the length of each short side is about 10 μm to 40 μm and the length of each long side is about 20 μm to 500 μm.

Figure 4:
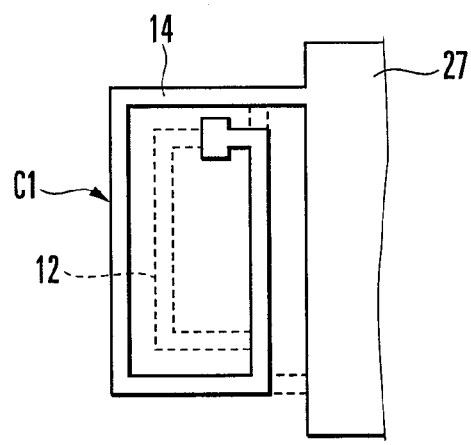
FIG. 4 is a plan view schematically showing a coil main body in the stacked coil of the magnetic field sensor shown in FIG. 1.

The "outline shape of the stacked coil when seen from the top" in the present invention indicates an outline shape that the wound portion of a coil main body exhibits when the coil main body formed of the respective coil forming elements and a contact plug that electrically connects them is seen from the top. In the magnetic field sensor 30 of this embodiment, the first coil forming element 12 and second coil forming element 14 partially overlap to form a coil main body C1 in which the outline shape of the wound portion when seen from the top forms a rectangle, as shown in FIG. 4. Of the members shown in FIG. 4, those that are shown in FIG. 1 are denoted by the same reference numerals as in FIG. 1.

(3) Strip Line;

As described above, the strip line 20 comprises a stacked body of the lower grounding layer 21, line portion first interlayer dielectric film 22, strip conductor 23, line portion second interlayer dielectric film 24, and upper grounding layer 27.

As shown in FIG. 1 or 2, the lower grounding layer 21 comprises a conductor layer in which the line width at the end on the stacked coil 10 side is larger than the line width at another region 21a to form a rectangular region 21b, and its planar shape forms a T. The lower grounding layer 21 can be fabricated by patterning a conductor layer, which is formed using a conductive material such as copper or aluminum with a method such as plating, PVD, CVD, or the like, into a predetermined shape by a method such as etching. The lower grounding layer 21 can also be formed by depositing the conductive material described above on the substrate 1 with PVD or CVD using a mask with a predetermined shape.

The thickness of the lower grounding layer 21 can be appropriately selected within the range of about 1 μm to 5 μm in accordance with the conductivity of the material. The length of the short side (indicating a side that extends parallel to the longitudinal axis of the strip line 20) observed when the lower grounding layer 21 is seen from the top is preferably about 4 times or more the line width of the strip conductor 23 from the viewpoint of enhancing the electric field shield effect obtained by the rectangular region 21b and a rectangular region 27b (to be described later) as much as possible. From the viewpoint of obtaining a magnetic field sensor 30 having a high spatial resolution, the length of the short side is preferably set to about 8 times or less the line width of the strip conductor 23. The length of the long side (indicting a side that extends perpendicular to the longitudinal axis of the strip line 20 when seen from the top) observed when the rectangular region 21b is seen from the top can be appropriately selected within the range of about 25 μm to 550 μm in accordance with the size of the stacked coil 10.

As shown in FIG. 1, the line portion first interlayer dielectric film 22 comprises an insulating film in which the line width at the end on the stacked coil 10 side is larger than the line width at another region 22a to form a rectangular region 22b, and its planar shape forms a T. The line width of the region 22a is smaller than that of the region 21a in the lower grounding layer 21, and the rectangular region 22b is larger than the rectangular region 21b of the lower grounding layer 21. The upper surface of the line portion first interlayer dielectric film 22 forms a flat surface.

As shown in FIGS. 1 to 3, the line portion first interlayer dielectric film 22 covers the rectangular region 21b to prevent short-circuiting between the rectangular region 21b and strip conductor 23 and between the strip conductor 23 and region 21a on the region 21a. The thickness of the line portion first interlayer dielectric film 22 on the lower grounding layer 21 can be appropriately selected within the range of about 1 μm to 10 μm. In the strip line 20, the line portion first interlayer dielectric film 22 corresponds to the lower interlayer dielectric film.

The rectangular region 22b of the line portion first interlayer dielectric film 22 continues to the coil portion first interlayer dielectric film 11 described above (see FIGS. 1 to 3). Although the line portion first interlayer dielectric film 22 and coil portion first interlayer dielectric film 11 may be formed separately, it is simpler and more convenient to form them at once by patterning a large-sized insulating layer into a predetermined shape. In this case, the boundary between the stacked coil 10 and strip line 20 serves as the boundary between the line portion first interlayer dielectric film 22 and coil portion first interlayer dielectric film 11. The boundary between the stacked coil 10 and strip line 20 is a vertical plane VF including the end faces of the lower grounding layer 21 and rectangular region 22b on the stacked coil 10 side, as shown in FIG. 3. The respective end faces are included in the strip line 20.

The strip conductor 23 comprises a conductor to connect the stacked coil 10 to a measurement device (not shown) to measure an electromagnetically induced electromotive force. One end of the strip conductor 23 connects to, e.g., a high-frequency cable. A transmission line having the same characteristic impedance as that of the high-frequency cable may be interposed between the strip conductor 23 and the high-frequency cable to relay the strip conductor 23 to the high-frequency cable. One end of the high-frequency cable connects to the measurement device described above. The line width of the strip conductor 23 can be appropriately selected within the range of about 1 μm to 4 μm. This line width is preferably constant in view of easily forming a strip line 20 having a desired characteristic impedance. The thickness of the strip conductor 23 can be appropriately selected within the range of about 0.5 μm to 2 μm.

Figure 5:
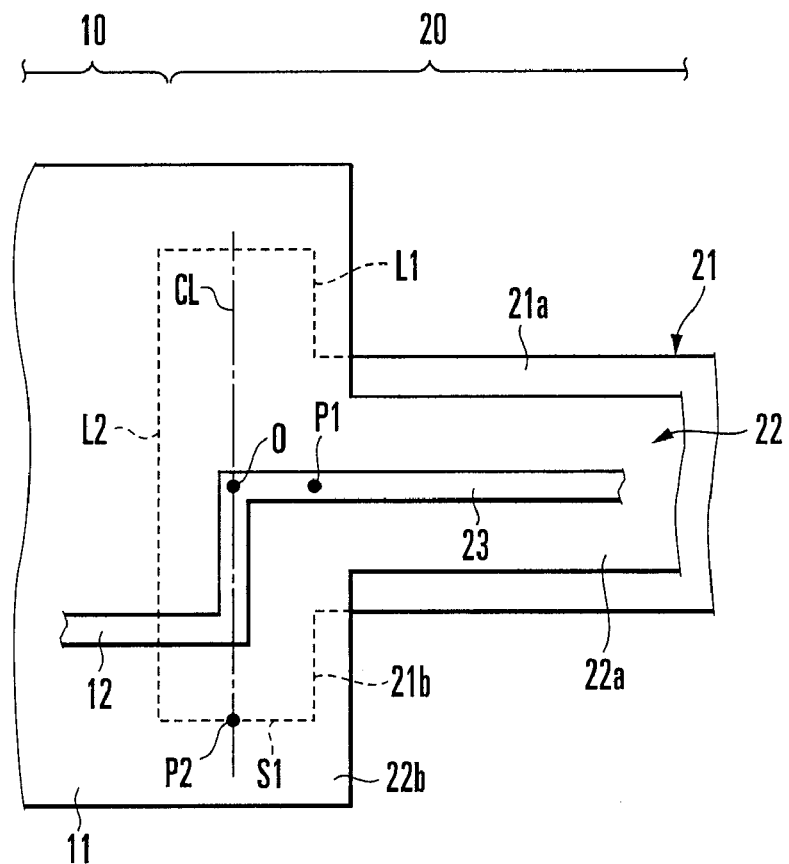
FIG. 5 is a plan view schematically showing the positional relationship between a strip conductor and lower grounding layer on a stacked coil side in the magnetic field sensor shown in FIG. 1.

As shown in FIG. 1, the planar shape of the strip conductor 23 is linear on the region 22a of the line portion first interlayer dielectric film 22, and is bent like a crank on the rectangular region 22b of the line portion first interlayer dielectric film 22. As shown in FIG. 5, when seen from the top, the strip conductor 23 on the rectangular region 22b extends through a middle point P1 of a long side L1 on the proximal portion side (indicating the region 21a side) of the rectangular region 21b and a central point O of the rectangular region 21b of the lower grounding layer 21, switches its direction by 90° by at the central point O to extend along a central line CL which extends through a middle point P2 of a short side S1 of the rectangular region 21b, switches its direction again by 90° toward the stacked coil 10 before reaching the short side S1, and reaches a long side L2 on the stacked coil 10 side of the rectangular region 21b. From the viewpoint of shielding the strip conductor 23 from the external electric field as much as possible by the rectangular region 21b of the lower grounding layer 21 and the rectangular region 27b of an upper grounding layer (to be described later), the gap seen from the top between the stacked coil 10 side end of the strip conductor 23 and that short side S1, among the short sides of the rectangular region 21b of the lower grounding layer 21, which is the closest to the stacked coil 10 side end is preferably set to twice or more the line width of the strip conductor 23. When the strip conductor 23 is set to have the planar shape as described above, it can be easily shielded from the external electric field.

One end of the strip conductor 23 continues to one end (one end of the first coil forming element 12) of the stacked coil 10 described above (see FIG. 1 or 3). Although the strip conductor 23 and first coil forming element 12 may be formed separately, it is simpler and more convenient to form them at once by patterning a large-sized conductor layer into a predetermined shape.

Similar to the line portion first interlayer dielectric film 22, the line portion second interlayer dielectric film 24 comprises an insulating film in which the line width at the end on the stacked coil 10 side is larger than the line width at another region 24a to form a rectangular region 24b, and its planar shape forms a T (see FIG. 1). The planar shape and size of the line portion second interlayer dielectric film 24 are equal to those of the line portion first interlayer dielectric film 22 described above. The two line portion interlayer dielectric films overlap each other when seen from the top. The upper surface of the line portion second interlayer dielectric film forms a flat surface.

As shown in FIGS. 1 to 3, the line portion second interlayer dielectric film 24 having such a shape covers the strip conductor 23 to prevent short-circuiting between the strip conductor 23 and upper grounding layer 27. The thickness of the line portion second interlayer dielectric film 24 on the strip conductor 23 can be appropriately selected within the range of about 1 µm to 10 µm. From the viewpoint that the characteristic impedance of the strip line 20 can be easily controlled to a desired value, the thickness of the line portion second interlayer dielectric film 24 on the strip conductor 23 is preferably set substantially equal to that of the line portion first interlayer dielectric film 22 on the lower grounding layer 21. In the strip line 20, the line portion second interlayer dielectric film 24 corresponds to the upper interlayer dielectric film.

The rectangular region 24b of the line portion second interlayer dielectric film 24 continues to the coil portion second interlayer dielectric film 13 described above (see FIGS. 1 to 3). Although the line portion second interlayer dielectric film 24 and coil portion second interlayer dielectric film 13 may be formed separately, it is simpler and more convenient to form them at once by patterning a large-sized insulating layer into a predetermined shape.

The upper grounding layer 27 comprises a conductor layer in which the line width at the end on the stacked coil 10 side is larger than the line width at another region 27a to form a rectangular region 27b, and its planar shape forms a T. The rectangular region 27b and the rectangular region 21b of the lower grounding layer described layer overlap each other when seen from the top.

As shown in FIG. 1 or 2, the region 27a of the upper grounding layer 27, except for its end on the rectangular region 27b side, forms the outer surface of the strip line 20 together with the region 21a of the lower grounding layer 21. Of the strip line 20, that region the outer surface of which is formed of the regions 21a and 27a forms a shield type strip line region 20S.

Figure 6:
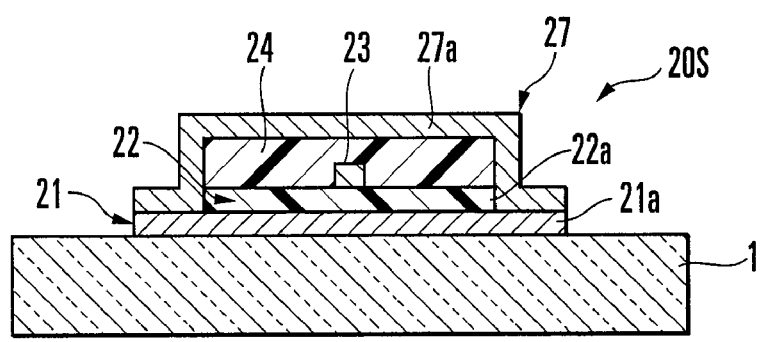
FIG. 6 is a schematic view of a section taken along the line VI-VI shown in FIG. 2.

As shown in FIG. 6, in the strip line region 20S, the line portion second interlayer dielectric film 24 covers the strip conductor 23 formed on the line portion first interlayer dielectric film 22, and the lower grounding layer 21 and upper grounding layer 27 covers the resultant structure. This can facilitate reliably, easily shielding the strip conductor 23 from the external electric field. This consequently increases the S/N ratio of the magnetic field sensor 30 easily. The members shown in FIG. 6 are all shown in FIG. 1 or 2, and accordingly denoted by the same reference numerals as in FIG. 1 or 2.

The rectangular region 27b of the upper grounding layer 27 cooperates with the rectangular region 21b of the lower grounding layer 21 described above to shield, of the strip conductor 23, a region that overlaps the two rectangular regions 21b and 27b when seen from the top from the external electric field. The rectangular region 27b continues to one end (one end of the second coil forming element 14) of the stacked coil 10 described above (see FIG. 1 or 3). Although the upper grounding layer 27 and second coil forming element 14 may be formed separately, it is simpler and more convenient to form them at once by patterning a large-sized conductor layer into a predetermined shape. The thickness of the upper grounding layer 27 can be appropriately selected within the range of about 1 µm to 5 µm in accordance with the conductivity of the material of the upper grounding layer 27.

The characteristic impedance of the strip line 20 constituted by the respective members described above is preferably set to equal to that of the high-frequency cable which is used to connect the strip line 20 to the measurement device to measure the electromotive force induced in the stacked coil 10. When the characteristic impedance of the strip line 20 is selected in this manner, the transmission loss can be decreased easily. Appropriate selection of the thicknesses and dielectric constants of the line portion first interlayer dielectric film 22 and line portion second interlayer dielectric film 24 and the thickness and line width of the strip conductor 23 can adjust the characteristic impedance of the strip line 20.

The magnetic field sensor 30 having the structure described above can be downsized easily as the known micropatterning technique can form its stacked coil 10 and strip line 20. As the number of turns of the stacked coil 10 is larger than 1, as compared to a loop coil with the number of turns that is 1 or less, even when the magnetic flux penetrating through the respective coil forming elements of the stacked coil 10 is small, a comparatively large electromotive force can be induced. Due to its structure, the stacked coil 10 can be easily designed to have such a shape and size that it can be easily set close to a measurement target object. For example, when the outline shape of the stacked coil 10 when seen from the top is rectangular as described above, as compared to a case wherein the outline shape is circular, even when the stacked coil 10 is downsized, the magnetic flux penetrating through the stacked coil 10 can increase. Therefore, with the magnetic field sensor 30 according to this embodiment, downsizing can achieve a high spatial resolution.

As most of the strip line 20 forms the shield type strip line region 20S, the strip conductor 23 can be shielded from the external electric field to increase the SN ratio easily.

Second Embodiment

The structure of a magnetic field sensor according to the second embodiment of the present invention is equal to that of the magnetic field sensor 30 of the first embodiment except for the shapes of a first coil forming element 112 and second coil forming element 114. Thus, the overall view of the magnetic field sensor, the exploded perspective views of the respective members, and the sectional structure will be omitted.

Figure 7A:
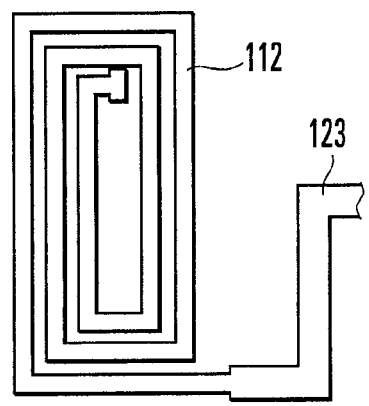
FIG. 7A is a plan view schematically showing a first coil forming element in a magnetic field sensor according to the second embodiment and a strip conductor which continues to the first coil forming element.

As shown in FIG. 7A, the first coil forming element 112 comprises a coil the number of turns of which is slightly larger than 2.5, and its one end continues to a strip conductor 123. The number of turns of the first coil forming element 112 is larger than that of the magnetic field sensor 30 of the first embodiment described above. Thus, the line width of the first coil forming element 112 is smaller than that of the first coil forming element 12 of the magnetic field sensor 30 of the first embodiment. The line width of the strip conductor 123 is equal to, e.g., that of the strip conductor 23 of the magnetic field sensor 30 of the first embodiment.

Figure 7B:
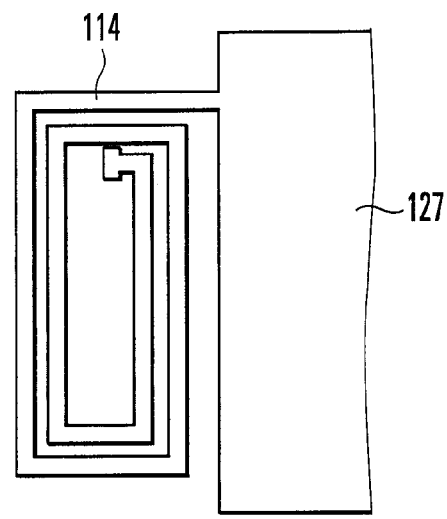
FIG. 7B is a plan view schematically showing a second coil forming element in the magnetic field sensor according to the second embodiment and an upper grounding layer which continues to the second coil forming element.

Similarly, the number of turns of the second coil forming element 114 shown in FIG. 7B is larger than that of the second coil forming element 14 of the magnetic field sensor 30 of the first embodiment. Thus, the line width of the second coil forming element 114 is smaller than that of the second coil forming element 14 of the magnetic field sensor 30 of the first embodiment. One end of the second coil forming element 114 continues to an upper grounding layer 127. The size and shape of the upper grounding layer 127 are equal to those of, e.g., the upper grounding layer 27 of the magnetic field sensor 30 of the first embodiment.

Figure 7C:
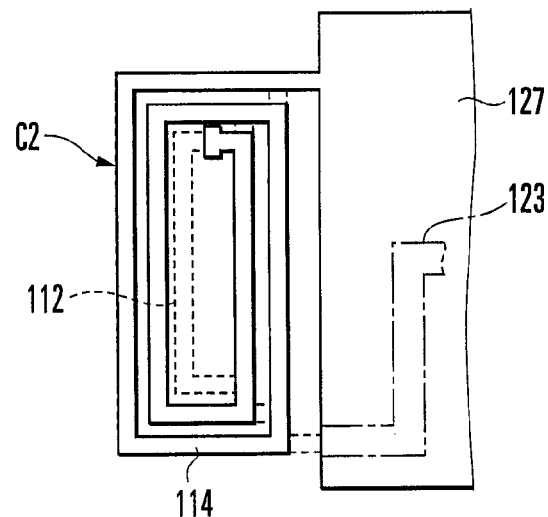
FIG. 7C is a plan view schematically showing a coil main body in the stacked coil of the magnetic field sensor according to the second embodiment.

As the number of turns of the first coil forming element 112 and that of the second coil forming element 114 are selected as described above, the number of turns of a coil main body C2 is larger than 4, as shown in FIG. 7C. Namely, in the magnetic field sensor of this embodiment, the number of turns of the stacked coil is larger than that of the stacked coil 10 of the magnetic field sensor 30 of the first embodiment. Therefore, with the magnetic field sensor of this embodiment, the detection sensitivity can be increased to achieve a high spatial resolution more easily.

Third Embodiment

Figure 8:
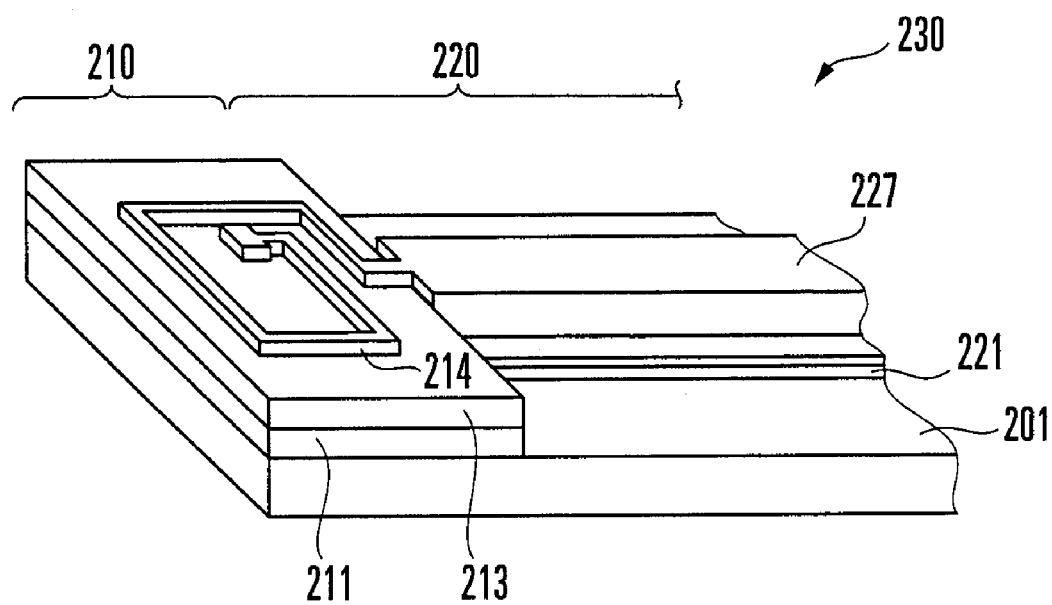
FIG. 8 is a perspective view schematically showing a magnetic field sensor according to the third embodiment of the present invention.

As shown in FIG. 8, a magnetic field sensor 230 according to the third embodiment of the present invention is largely different from the magnetic field sensor 30 of the first embodiment in that the entire outer surface of a strip line 220 is formed of a lower grounding layer 221 and upper grounding layer 227, and that the entire strip line 220 forms a shield type strip line region. Except for this, the arrangement of the magnetic field sensor 230 is identical to that of the magnetic field sensor 30 of the first embodiment. Hence, members that are common in function with the constituent members of the magnetic field sensor 30 are denoted by reference numerals formed by adding "200" to the numerical portions of the corresponding reference numerals used in FIGS. 1 and 2, and a description thereof will be omitted.

In this magnetic field sensor 230, the entire strip line 220 forms the shield type strip line region. Accordingly, the shapes of the respective members excluding a substrate 201, coil portion first interlayer dielectric film 211, and coil portion second interlayer dielectric film 213 are changed as shown in FIGS. 9A to 9C.

Figure 9A:
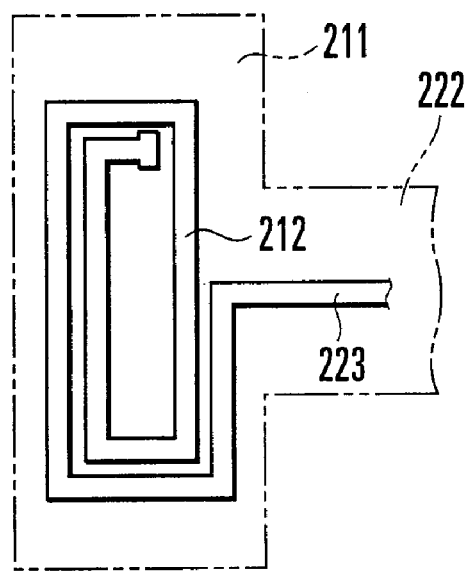
FIG. 9A is a plan view schematically showing a coil portion first interlayer dielectric film, first coil forming element, line portion first interlayer dielectric film, and strip conductor in the magnetic field sensor shown in FIG. 8.
Figure 9B:
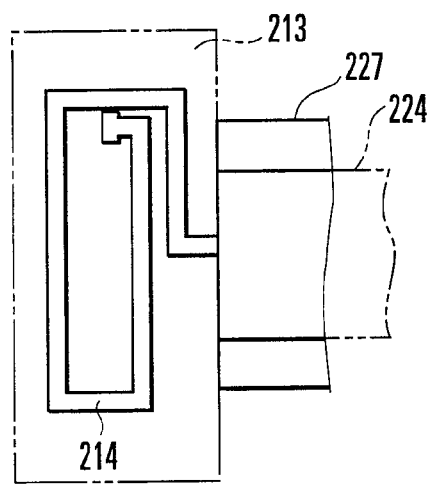
FIG. 9B is a plan view schematically showing a coil portion second interlayer dielectric film, second coil forming element, line portion second interlayer dielectric film, and upper grounding layer in the magnetic field sensor shown in FIG. 8.

As shown in FIG. 9A, the entire strip line 220 forms the shield type strip line region, and accordingly the planar shape of a strip conductor 223 is changed linearly. As shown in FIG. 9A or 9B, the planar shapes of a line portion first interlayer dielectric film 222, a line portion second interlayer dielectric film 224, and the upper grounding layer 227 are changed to form bands. Although not shown, the planar shape of the lower grounding layer 221 (see FIG. 8) is also changed to form a band. The lower grounding layer 221 and upper grounding layer 227 overlap each other when seen from the top.

As shown in FIG. 9A, as the strip conductor 223 is formed linearly, the number of turns of a first coil forming element 212 with one end that continues to the strip conductor 223 is slightly larger than that of the first coil forming element 12 of the magnetic field sensor 30 of the first embodiment. Similarly, as shown in FIG. 9B, the number of turns of a second coil forming element 214 is also slightly larger than that of the second coil forming element 14 of the magnetic field sensor of the first embodiment. One end of the second coil forming element 214 continues to the center of one end of the upper grounding layer 227. A contact plug (not shown) formed in the coil portion second interlayer dielectric film 213 brings the first and second coil forming elements 212 and 214 into contact with each other through a via hole.

Figure 9C:
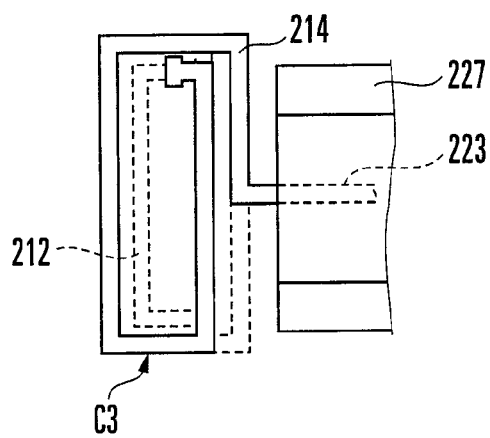
FIG. 9C is a plan view schematically showing a coil main body in the stacked coil of the magnetic field sensor shown in FIG. 8.

As a result, as shown in FIG. 9C, the number of turns of a coil main body C3 of a stacked coil 210 is three. That end of the first coil forming element 212 which continues to the strip conductor 223 and that end of the second coil forming element 214 which continues to the upper grounding layer 227 overlap each other when seen from the top. In FIGS. 9A to 9C, for the illustrative convenience, the outline shapes when seen from the top of the coil portion interlayer dielectric film 211 and the line portion interlayer dielectric film 222 which continues to it and is joined to it, and the coil portion interlayer dielectric film 213 and the line portion interlayer dielectric film 224 which continues to it and is joined to it are indicated by alternate long and two short dashed lines, respectively.

The magnetic field sensor 230 of this embodiment having the structure described above provides the same technical effects as those of the magnetic field sensor 30 of the first embodiment. In the magnetic field sensor 230 of this embodiment, as the number of turns of the stacked coil 210 (coil main body C3) is as large as 3, the detection sensitivity can improve more easily than in the magnetic field sensor 30 of the first embodiment. Even when the stacked coil 210 is downsized, a practical detection sensitivity can be easily obtained, so that downsizing can achieve a high spatial resolution more easily. As the entire strip line 220 forms the shield type strip line region, the entire strip conductor 223 can be shielded from the external electric field to obtain a higher S/N ratio.

Fourth Embodiment

Figure 10:
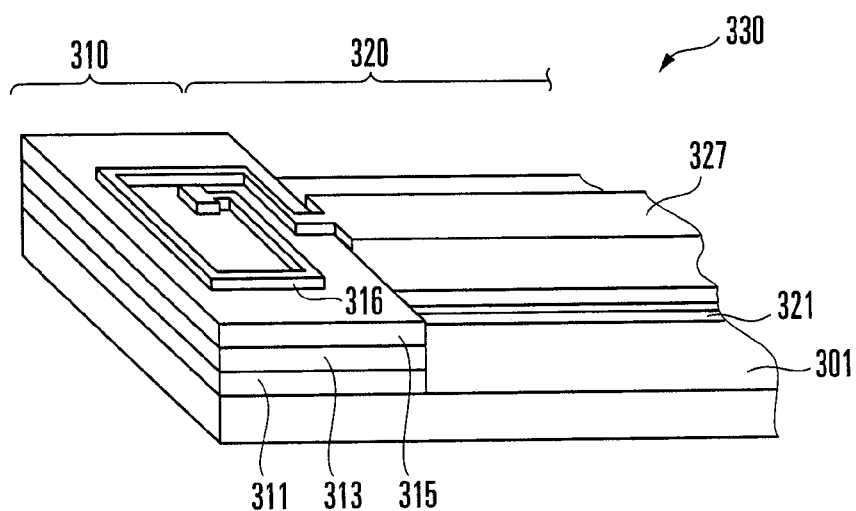
FIG. 10 is a perspective view schematically showing a magnetic field sensor according to the fourth embodiment of the present invention.

As shown in FIG. 10, in a magnetic field sensor 330 according to the fourth embodiment of the present invention, a stacked coil 310 and a strip line 320 which continues to it are formed on a substrate 301. The magnetic field sensor 330 is largely different from the magnetic field sensor 230 of the third embodiment in that the coil main body of the stacked coil 310 is formed using three coil forming elements. The magnetic field sensor 330 is similar to the magnetic field sensor 230 of the third embodiment in that the entire strip line 320 forms a shield type strip line region.

Of the constituent members of the magnetic field sensor 330, members that are common in function with the constituent members of the magnetic field sensor 230 of the third embodiment are denoted by reference numerals formed by adding "100" to the numerical portions of the corresponding reference numerals used in FIG. 8 or FIGS. 9A to 9C, and a description thereof will be omitted.

In the magnetic field sensor 330 according to this embodiment, in order to form the coil main body using the three coil forming elements, a coil portion first interlayer dielectric film, first coil forming element, coil portion second interlayer dielectric film, second coil forming element, coil portion third interlayer dielectric film, and third coil forming element are stacked on the substrate 301 in the order named.

A contact plug formed in the coil portion second interlayer dielectric film brings the first and second coil forming elements into contact with each other through a via hole. A contact plug formed in the coil portion third interlayer dielectric film brings the second and third coil forming elements into contact with each other through a via hole. The stacked coil 310 is formed in this manner. The strip line 320 has a structure in which a lower grounding layer, line portion first interlayer dielectric film, strip conductor, line portion second interlayer dielectric film, line portion third interlayer dielectric film, and upper grounding layer are stacked on the substrate 301 in the order named.

Figure 11A:
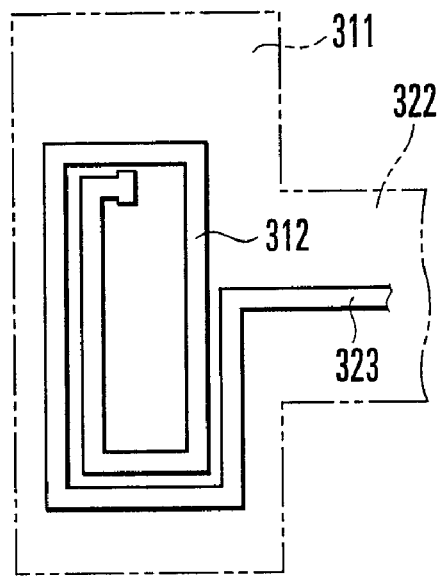
FIG. 11A is a plan view schematically showing a coil portion first interlayer dielectric film, first coil forming element, line portion first interlayer dielectric film, and strip conductor in the magnetic field sensor shown in FIG. 10.
Figure 11B:
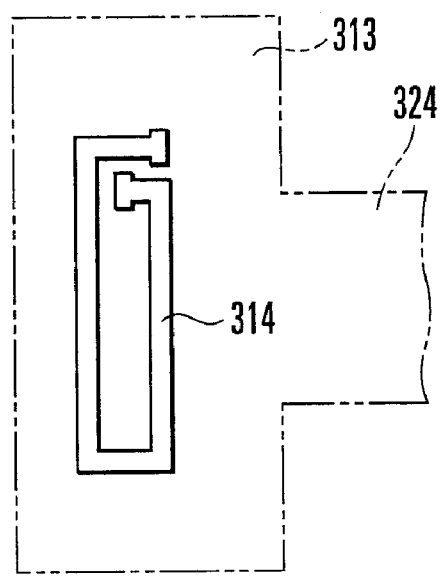
FIG. 11B is a plan view schematically showing a coil portion second interlayer dielectric film, second coil forming element, and line portion second interlayer dielectric film in the magnetic field sensor shown in FIG. 10.

As is apparent from comparison of FIGS. 11A to 11D according to this embodiment with FIG. 9A to 9C described above, the stacked coil 310 of the magnetic field sensor 330 according to this embodiment has a structure in which a coil portion second interlayer dielectric film 313 and second coil forming element 314 shown in FIG. 11B are inserted between the first coil forming element 212 and coil portion second interlayer dielectric film 213 of the stacked coil 210 of the magnetic field sensor 230 of the third embodiment described above. With reference to the substrate 301, of the three, coil forming elements 312 and 316 and a coil forming element 314, the first coil forming element 312 corresponds to the lowermost coil forming element, and the third coil forming element 316 corresponds to the uppermost coil forming element. The strip line 320 in the magnetic field sensor 330 of this embodiment has a structure in which a line portion second interlayer dielectric film 324 shown in FIG. 11B is inserted between the strip conductor 223 of the strip line 220 and the line portion second interlayer dielectric film 224 of the magnetic field sensor 230 of the third embodiment.

As shown in FIG. 11B, the second coil forming element 314 formed on the coil portion second interlayer dielectric film 313 comprises a coil the number of turns of which is slightly larger than 1. The second coil forming element 314 is in contact with the first coil forming element 312 through a contact plug (not shown) formed in a via hole in the coil portion second interlayer dielectric film 313, and in contact with the third coil forming element 316 through a contact plug (not shown) formed in a via hole in a coil portion third interlayer dielectric film 315. Consequently, as shown in FIG. 11D, the number of turns of a coil main body C4 is 4, which is larger than that of the coil main body C3 of the magnetic field sensor 230 of the third embodiment.

Figure 11C:
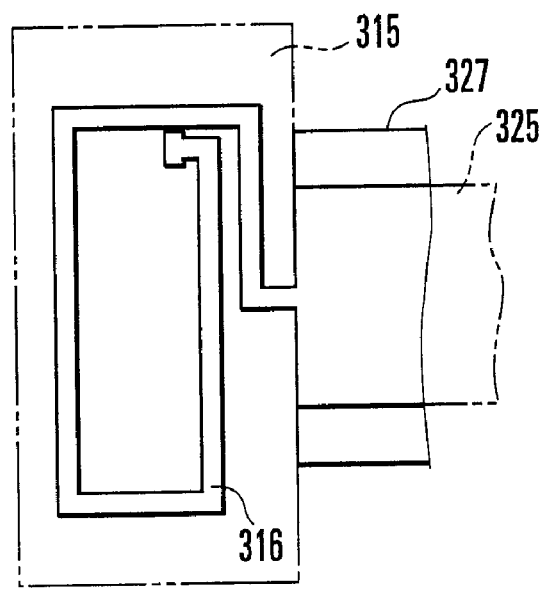
FIG. 11C is a plan view schematically showing a coil portion third interlayer dielectric film, third coil forming element, line portion third interlayer dielectric film, and upper grounding layer in the magnetic field sensor shown in FIG. 10.
Figure 11D:
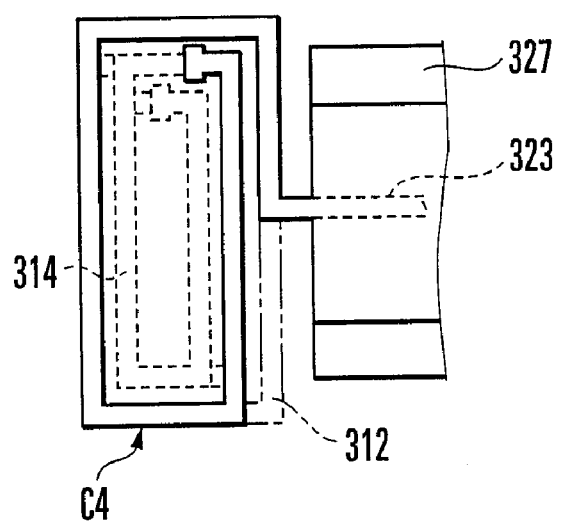
FIG. 11D is a plan view schematically showing a coil main body in the stacked coil of the magnetic field sensor shown in FIG. 10.

In FIGS. 11A, 11B, and 11C, for the sake of illustrative convenience, the outline shapes when seen from the top of a coil portion interlayer dielectric film 311 and a line portion interlayer dielectric film 322 which continues to it and is joined to it, the coil portion interlayer dielectric film 313 and the line portion interlayer dielectric film 324 which continues to it and is joined to it, and the coil portion interlayer dielectric film 315 and a line portion interlayer dielectric film 325 which continues to it and is joined to it are indicated by alternate long and two short dashed lines, respectively.

Figure 12:
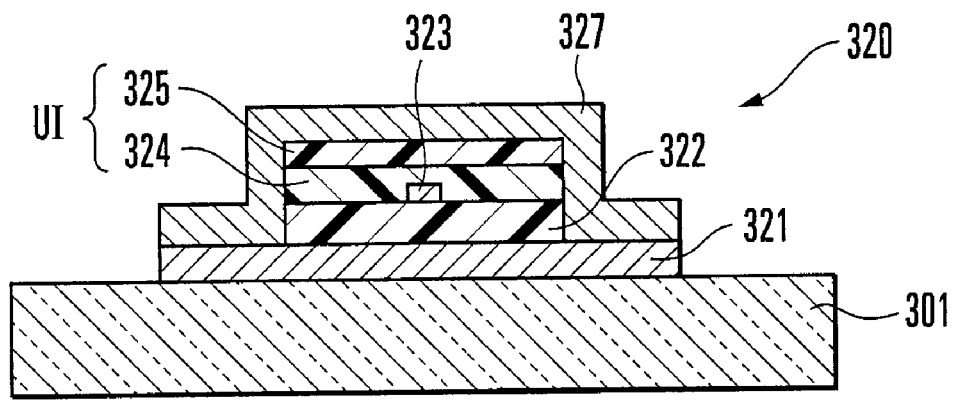
FIG. 12 is a schematic view showing the sectional structure of a strip line in the magnetic field sensor shown in FIG. 10.

As shown in FIG. 12, a strip conductor 323 is formed on the line portion first interlayer dielectric film 322. The line portion second interlayer dielectric film 324 covers the strip conductor 323. The line portion third interlayer dielectric film 325 is stacked on the line portion second interlayer dielectric film 324. In the strip line 320, the line portion first interlayer dielectric film 322 corresponds to a lower interlayer dielectric film, and the line portion second interlayer dielectric film 324 and line portion third interlayer dielectric film 325 correspond to an upper interlayer dielectric film UI. From the viewpoint that the characteristic impedance of the strip line 320 can be easily controlled to a desired value, the thickness of the line portion first interlayer dielectric film 322 serving as the lower interlayer dielectric film is preferably set substantially equal to that of the upper interlayer dielectric film UI.

The magnetic field sensor 330 of this embodiment having the structure described above provides the same technical effects as those of the magnetic field sensor 230 of the third embodiment. As the number of turns of the stacked coil 310 (coil main body C4) in the magnetic field sensor 330 is as large as 4, the detection sensitivity can be improved more easily than in the magnetic field sensor 230 of the third embodiment. Even when the stacked coil 310 is downsized, a practical detection sensitivity can be easily obtained, so that downsizing can achieve a high spatial resolution more easily.

Fifth Embodiment

Figure 13:
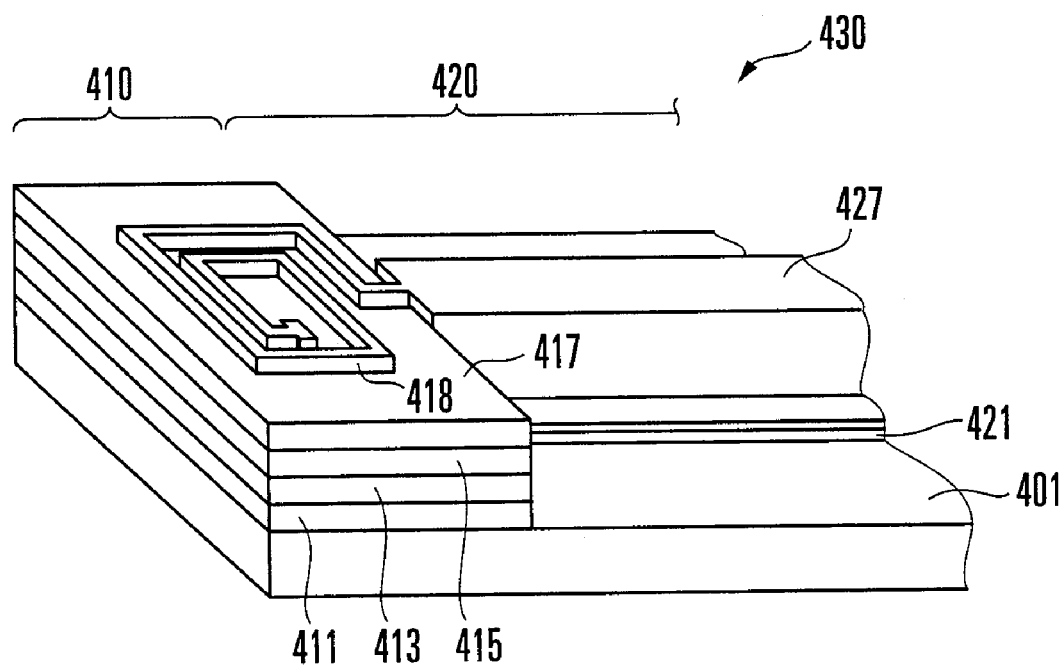
FIG. 13 is a perspective view schematically showing a magnetic field sensor according to the fifth embodiment of the present invention.

As shown in FIG. 13, in a magnetic field sensor 430 according to the fifth embodiment of the present invention, a stacked coil 410 and a strip line 420 which continues to it are formed on a substrate 401. The magnetic field sensor 430 is largely different from the magnetic field sensor 230 of the third embodiment in that the coil main body of the stacked coil 410 is formed using four coil forming elements. The magnetic field sensor 430 is similar to the magnetic field sensor 230 of the third embodiment in that the entire strip line 420 forms a shield type strip line region.

Of the constituent members of the magnetic field sensor 430, members that are common in function with the constituent members of the magnetic field sensor 230 of the third embodiment are denoted by reference numerals formed by adding "200" to the numerical portions of the corresponding reference numerals used in FIG. 8 or FIGS. 9A to 9C, and a description thereof will be omitted. A line portion second interlayer dielectric film is denoted by new reference numeral "423", and a strip conductor is denoted by new reference numeral "424".

In the magnetic field sensor 430 according to this embodiment, in order to form the coil main body using the four coil forming elements, a coil portion first interlayer dielectric film, first coil forming element, coil portion second interlayer dielectric film, second coil forming element and lead portion, coil portion third interlayer dielectric film, third coil forming element, coil portion fourth interlayer dielectric film, and fourth coil forming element are stacked on the substrate 401 in the order named. A contact plug formed in the coil portion interlayer dielectric film brings two coil forming elements, which are adjacent to each other through the coil portion interlayer dielectric film, into contact with each other through a via hole. The stacked coil 410 is formed in this manner. The strip line 420 has a structure in which a lower grounding layer, line portion first interlayer dielectric film, line portion second interlayer dielectric film, strip conductor, line portion third interlayer dielectric film, line portion fourth interlayer dielectric film, and upper grounding layer are stacked on the substrate 401 in the order named.

Figure 14A:
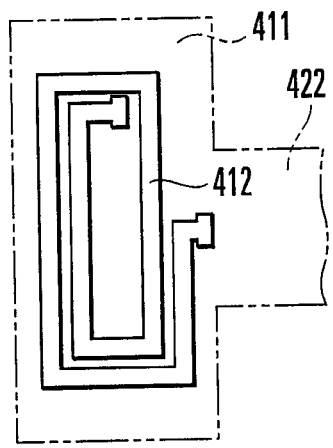
FIG. 14A is a plan view schematically showing a coil portion first interlayer dielectric film, first coil forming element, and line portion first interlayer dielectric film in the magnetic field sensor shown in FIG. 13.

As shown in FIG. 14A, the number of turns of a first coil forming element 412 formed on a coil portion first interlayer dielectric film 411 is larger than 1.5. The coil portion first interlayer dielectric film 411 continues to a line portion first interlayer dielectric film 422 having a band-like planar shape.

Figure 14B:
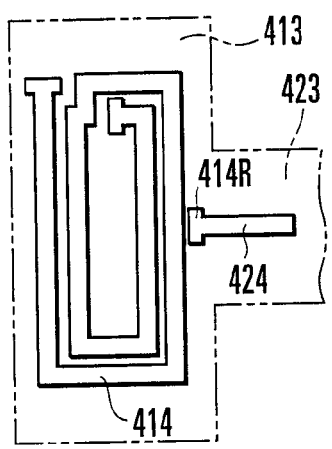
FIG. 14B is a plan view schematically showing a coil portion second interlayer dielectric film, second coil forming element, extending portion, line portion second interlayer dielectric film, and strip conductor in the magnetic field sensor shown in FIG. 13.

As shown in FIG. 14B, the number of turns of a second coil forming element 414 formed on a coil portion second interlayer dielectric film 413 is larger than 1.5. An extending portion 414R is formed on the coil portion second interlayer dielectric film 413 to be close to the second coil forming element 414.

A contact plug (not shown) formed in the coil portion second interlayer dielectric film 413 brings one end of the second coil forming element 414 and one end of the coil portion first interlayer dielectric film 412 into contact with each other through a via hole. Another contact plug (not shown) formed in the coil portion second interlayer dielectric film 413 brings the other end of the first coil forming element 412 and one end of the extending portion 414R into contact with each other through a via hole. The other end of the extending portion 414R continues to one end of the strip conductor 424 formed on the line portion second interlayer dielectric film 423.

Figure 14C:
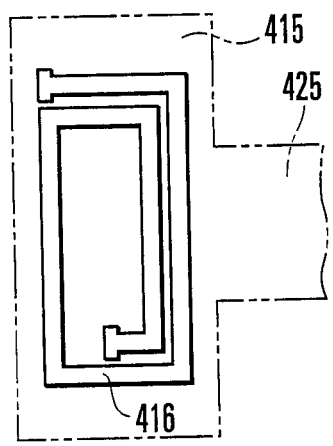
FIG. 14C is a plan view schematically showing a coil portion third interlayer dielectric film, third coil forming element, and line portion third interlayer dielectric film in the magnetic field sensor shown in FIG. 13.

As shown in FIG. 14C, the number of turns of a third coil forming element 416 formed on a coil portion third interlayer dielectric film 415 is larger than 1.5. A contact plug (not shown) formed in the coil portion third interlayer dielectric film 415 brings one end of the third coil forming element 416 and one end of the second coil forming element 414 into contact with each other through a via hole.

Figure 14D:
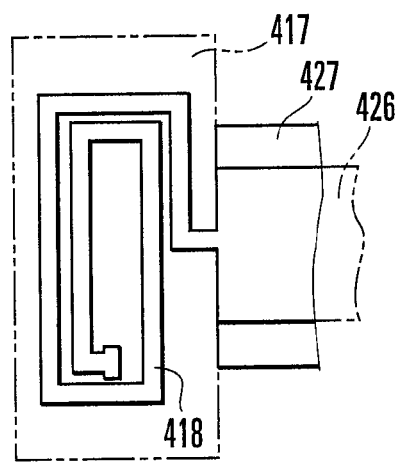
FIG. 14D is a plan view schematically showing a coil portion fourth interlayer dielectric film, fourth coil forming element, line portion fourth interlayer dielectric film, and upper grounding layer in the magnetic field sensor shown in FIG. 13.

As shown in FIG. 14D, the number of turns of a fourth coil forming element 418 formed on a coil portion fourth interlayer dielectric film 417 is larger than 1.5. A contact plug (not shown) formed in the coil portion fourth interlayer dielectric film 417 brings one end of the fourth coil forming element 418 and one end of the third coil forming element 416 into contact with each other through a via hole. The other end of the fourth coil forming element 418 continues to an upper grounding layer 427.

Figure 14E:
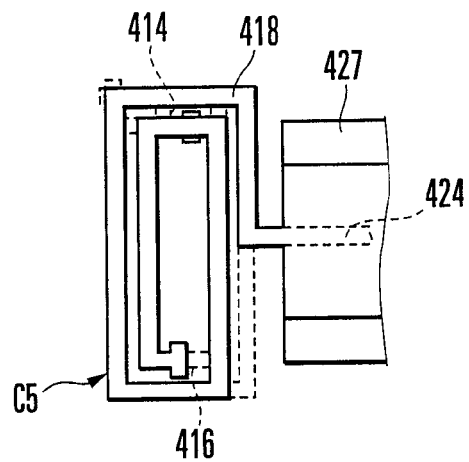
FIG. 14E is a plan view schematically showing a coil main body in the stacked coil of the magnetic field sensor shown in FIG. 13.

As shown in FIG. 14E, a coil main body C5 of the stacked coil 410 in the magnetic field sensor 430 of this embodiment comprises a coil the number of turns of which is 7. As the respective coil forming elements 412, 414, 416, and 418 have regions that overlap each other when seen from the top, the first coil forming element 412 does not appear in FIG. 14E. Of the four coil forming elements 412, 414, 416, and 418, the fourth coil forming element 418 corresponds to the uppermost coil forming element. Of the three remaining third coil forming elements 412, 414, and 416, the second coil forming element 414 corresponds to the middle coil forming element.

In FIGS. 14A, 14B, 14C, and 14D, for the sake of illustrative convenience, the outline shapes when seen from the top of the coil portion interlayer dielectric film 411 and the line portion interlayer dielectric film 422 which continues to it and is joined to it, the coil portion interlayer dielectric film 413 and the line portion interlayer dielectric film 423 which continues to it and is joined to it, the coil portion interlayer dielectric film 415 and a line portion interlayer dielectric film 425 which continues to it and is joined to it, and the coil portion interlayer dielectric film 417 and a line portion interlayer dielectric film 426 which continues to it and is joined to it are indicated by alternate long and two short dashed lines, respectively.

Figure 15:
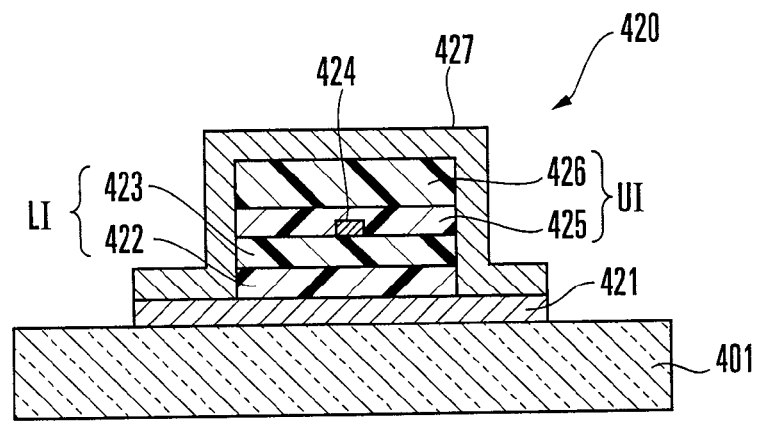
FIG. 15 is a schematic view showing the sectional structure of a strip line in the magnetic field sensor shown in FIG. 13.

As shown in FIG. 15, in the strip line 420, the line portion first interlayer dielectric film 422 and line portion second interlayer dielectric film 423 are stacked on a lower grounding layer 421 in the order named, and the strip conductor 424 is formed on the resultant structure. The line portion third interlayer dielectric film 425 covers the strip conductor 424, and the line portion fourth interlayer dielectric film 426 covers the resultant structure. The lower and upper grounding layers 421 and 427 cooperate with each other to form the entire outer surface of the strip line 420.

In the strip line 420, the line portion first interlayer dielectric film 422 and line portion second interlayer dielectric film 423 form a lower interlayer dielectric film LI, and the line portion third interlayer dielectric film 425 and line portion fourth interlayer dielectric film 426 form an upper interlayer dielectric film UI. From the viewpoint that the characteristic impedance of the strip line 420 can be easily controlled to a desired value, the thickness of the lower interlayer dielectric film LI is preferably set substantially equal to that of the upper interlayer dielectric film UI.

The magnetic field sensor 430 of this embodiment having the structure described above provides the same technical effects as those of the magnetic field sensor 330 of the fourth embodiment. As the number of turns of the stacked coil 410 (coil main body C5) in the magnetic field sensor 430 is as large as 7, the detection sensitivity can be improved more easily than in the magnetic field sensor 330 of the fourth embodiment. Even when the stacked coil 410 is downsized, a practical detection sensitivity can be easily obtained, so that downsizing can achieve a high spatial resolution more easily.

Modification

The magnetic field sensor according to the present invention is not limited to the respective magnetic field sensors of the first to fifth embodiments described above. For example, regarding the shape and the number of turns of the individual coil forming element, as far as the coil is wound in the same direction in the whole stacked coil, the individual coil forming element can have a desired shape and the desired number of turns (including a case wherein the number of turns is less than 1) in accordance with the size, spatial resolution, and the like required of a magnetic field sensor to be fabricated. To obtain a stacked coil with a large number of turns efficiently, it is preferable to set the number of turns of the individual coil forming element to 1 or more, in other words, to set the number of turns of the stacked coil to equal or more than the total number of the coil forming elements. The total number of coil forming elements that form the stacked coil can also be appropriately selected in accordance with the size, the spatial resolution, and the like required of the magnetic field sensor to be fabricated.

For example, to specify the place where electromagnetic waves of the megahertz (MHz) band to gigahertz (GHz) band are generated by a semiconductor integrated circuit, when the magnetic field sensor of the present invention is to be employed, it is preferable to set the thickness of the stacked coil (excluding the substrate) to about 2.5 μm to 20 μm. Thus, the shape and the number of turns of the individual coil forming element, and the total number of coil forming elements are appropriately selected such that the thickness of the stacked coil falls within a desired thickness range.

When the extending portion 414R (see FIG. 14B) is to be arranged close to one coil forming element as in the magnetic field sensor 430 of the fifth embodiment, the extending portion 414R may be regarded as one coil forming element or as part of the strip conductor.

Although one end of the stacked coil continues to the upper grounding layer in any one of the magnetic field sensors according to the first to fifth embodiments described above, it can continue to the lower grounding layer instead of the upper grounding layer. In this case, the layout pattern of the coil forming elements (including the extending portion 414R in the magnetic field sensor 430 of the fifth embodiment) of each magnetic field sensor is rotated through, e.g., 180° in the direction of thickness of the substrate.

From the viewpoint of shielding the strip conductor from the external electric field, the entire strip line preferably comprises a shield type strip line region. From the viewpoint of improving the productivity of the magnetic field sensor, it is also preferable to form the remaining region excluding the stacked coil side end as a shield type strip line region, as in the magnetic field sensor of the first or second embodiment.

To improve the productivity of the magnetic field sensor, it is preferable to set the number of layers of the line portion interlayer dielectric films in the strip line to be equal to the number of layers of the coil portion interlayer dielectric films in the stacked coil. If an interlayer dielectric film corresponding to a lower interlayer dielectric film and an interlayer dielectric film corresponding to an upper interlayer dielectric film are present, the number of layers of the line portion interlayer dielectric films can be smaller than the number of layers of the coil portion interlayer dielectric films. As in the stacked coil 410 of the magnetic field sensor 430 of the fifth embodiment described with reference to FIGS. 13 to 15, when a contact plug and extending portion are interposed between the lowermost coil forming element and the strip conductor, at least one of the interlayer dielectric film corresponding to the coil portion first interlayer dielectric film 411 shown in FIG. 13 and the interlayer dielectric film corresponding to the line portion first interlayer dielectric film 422 shown in FIG. 14 can be omitted because the substrate is insulating.

From the viewpoint of obtaining a highly durable magnetic field sensor, it is preferable to cover the stacked coil and strip line with a passivation film. The passivation film can be formed by depositing alumina or the like on the surface of each of the stacked coil and strip line by, e.g., PVD or CVD to a thickness falling within a range of about 10 μm to 30 μm.

In addition, various changes, modifications, combinations, and the like can be made. The magnetic field sensor according to the present invention is applicable to measurement of the magnetic field, measurement of the high-frequency noise current as a countermeasure against electromagnetic interference (EMI), specification of the path of the high-frequency noise current, and the like as well as as a small magnetic field generator to be used for electromagnetic resistance test in a small region. The magnetic field sensor according to the present invention can easily achieve a high spatial resolution. By achieving a high spatial resolution, magnetic field measurement can easily be performed in the vicinities of the individual wiring lines in an electronic circuit to obtain current values flowing in the respective wiring lines. If the current values of the respective wiring lines can be obtained, the electronic circuit can be evaluated from the current values. This makes it possible to optimize the electronic circuit including a countermeasure against electromagnetic interference (EMI) at an early stage of development.

Figure 16:
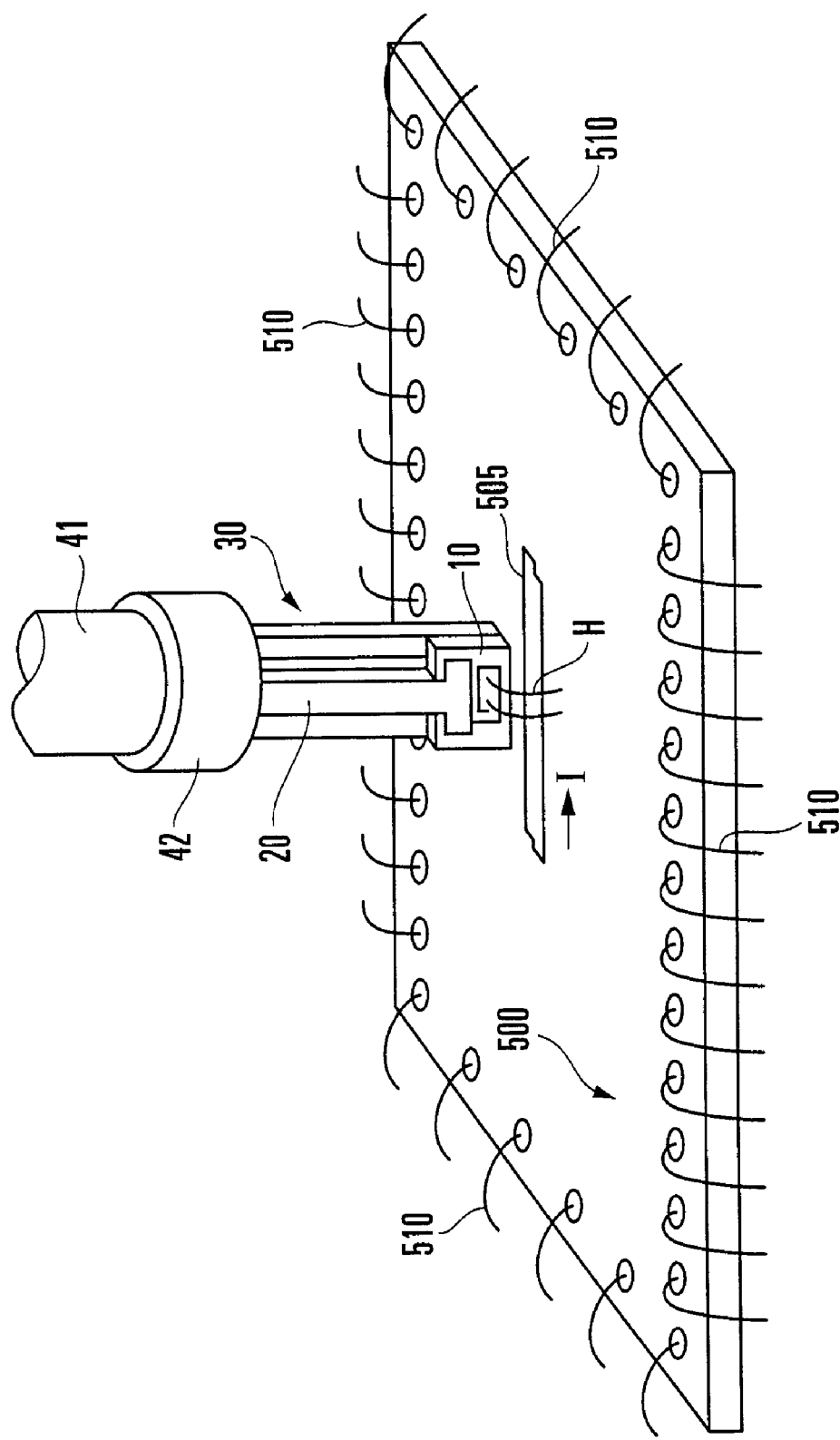
FIG. 16 is a perspective view schematically showing an example of use of the magnetic field sensor shown in FIG. 1.

Referring to FIG. 16, as an example of the use of the magnetic field sensor 30 according to the first embodiment described above, measurement of a magnetic near-field when specifying the path of a high-frequency noise current in a semiconductor integrated circuit substrate 500 in an open package will be described.

Referring to FIG. 16, one end of a strip line 20 of a magnetic field sensor 30 connects to a high-frequency cable 41. The high-frequency cable 41 connects to a measurement device (not shown) to measure an electromagnetically induced electromotive force. A connector (transmission line) can be interposed between the strip line 20 and high-frequency cable 41. At this time, when the characteristic impedance of the strip line 20 and that of the high-frequency cable 41 or connector 42 are set to be equal to each other, the transmission loss can be decreased.

The magnetic field sensor 30 is set close to the semiconductor integrated circuit substrate 500 which is exposed as its package has been opened. The magnetic field sensor 30 scans back and forth and to the left and right so that it can detect a detailed magnetic field distribution structure. When the upper surface of a stacked coil 10 of the magnetic field sensor 30 is set parallel to the side surface of a desired wiring line 505 of the semiconductor integrated circuit substrate 500, the magnetic field sensor 30 can measure a magnetic field H which is generated as a current I flows through the wiring line 505. At the same measurement point, the magnetic field is measured with the upper surface of the stacked coil 10 in the magnetic field sensor 30 being set parallel to the wiring line 505. Then, the magnetic field is measured with the upper surface of the stacked coil 10 being set perpendicular to the wiring line 505. Then, the magnetic field sensor 30 can measure the magnitude of the magnetic field component in the horizontal direction. The magnetic field sensor 30 can be downsized easily, as described above. If the magnetic field sensor 30 is downsized, the stacked coil 10 can be set close to a desired wiring line in the semiconductor integrated circuit substrate 500. Thus, a high spatial resolution can be obtained. Not only the magnetic field sensor 30 of the first embodiment but any magnetic field sensor according to the present invention can measure the magnetic near-field in the same manner. Reference numerals 510 in FIG. 16 denote bonding wires.

Effect of the Embodiments

In the embodiment described above, as the number of turns of the stacked coil is larger than 1, the magnetic flux penetrating through the stacked coil increases to be able to induce a comparatively large electromotive force. Hence, even when the stacked coil is downsized, a high detection sensitivity can be maintained. The shape and size of the stacked coil can be easily designed such that the stacked coil can be easily set close to the measurement target object. Therefore, according to the embodiments described above, a high spatial resolution can be achieved.

As the number of turns of the stacked coil is set to equal to or more than the total number of coil forming elements, the detection sensitivity can be improved easily. Even when the stacked coil is downsized, a practical detection sensitivity can be obtained easily. Thus, downsizing can easily achieve a magnetic field sensor having a high spatial resolution efficiently.

The outline shape of the stacked coil when seen from the top is rectangular. As compared to a case wherein, e.g., the outline shape of the stacked coil when seen from the top is circular, when the stacked coil is set close to the measurement target object, the magnetic flux penetrating through the stacked coil can increase. As a result, a high sensitivity can be achieved more easily.

When the total number of coil forming elements is 2 or 3, of the coil forming elements, with reference to the substrate, either one of that coil forming element which corresponds to the lowermost layer and that coil forming element which corresponds to the uppermost layer continues to one grounding layer, and the remaining one continues to the strip conductor. Thus, the strip conductor can be shielded from the external electric field easily.

One conductive film can be patterned to form one coil forming element and one grounding layer. Another conductive film can be patterned to form another coil forming element and a strip conductor, which facilitates the manufacture.

When the total number of coil forming elements is 4, of the coil forming elements, with reference to the substrate, either one of that coil forming element which corresponds to the lowermost layer and that coil forming element which corresponds to the uppermost layer continues to one grounding layer. An extending portion which continues to the strip conductor is formed close to one of the three remaining coil forming elements which is located at the middle. The remaining one of that coil forming element which corresponds to the lowermost layer and that coil forming element which corresponds to the uppermost layer is in contact with the extending portion through a via hole. Thus, the strip conductor can be shielded from the external electric field easily.

As the thickness of the upper interlayer dielectric film and that of the lower interlayer dielectric film are substantially equal to each other, on and under the strip conductor, the characteristic impedance of the strip line can be controlled to a desired value easily.

As the strip line includes the shield type strip line region, the strip conductor can be shielded from the external electric field easily. As a result, the S/N ratio can increase easily.

The characteristic impedance of the strip line is set equal to that of the high-frequency cable connected to one end of the strip line, or that of the transmission line that relays the strip line to the high-frequency cable. Thus, transmission loss can be suppressed easily between the stacked coil and the measurement device which measures an electromotive force induced in the stacked coil. The transmission line usually connects to the high-frequency cable. The characteristic impedance of the high-frequency cable and that of the transmission line are often adjusted to the same value.

The invention claimed is:

1. A magnetic field sensor characterized by comprising a substrate, a stacked coil formed on said substrate, and a strip line formed on said substrate to continue to said stacked coil, wherein
   said stacked coil comprises coil forming elements respectively formed of at least two conductor layers on said substrate, and contact means, formed in an interlayer dielectric film interposed between said conductor layers, for bringing said coil forming elements on and under said interlayer dielectric film into contact with each other through a via hole,
   said strip line comprises a structure in which a lower grounding layer, a lower interlayer dielectric film, a strip conductor, an upper interlayer dielectric film, and an upper grounding layer are stacked on said substrate in an order named,
   the number of turns of said stacked coil is larger than 1,
   one end of said stacked coil continues to either one grounding layer of said lower grounding layer and said upper grounding layer, and
   the other end of said stacked coil continues to said strip conductor.

2. A magnetic field sensor according to claim 1, characterized in that the number of turns of said stacked coil is not less than the total number of said coil forming elements.

3. A magnetic field sensor according to claim 1, characterized in that an outline shape of said stacked coil when seen from the top is rectangular.

4. A magnetic field sensor according to claim 1, characterized in that the total number of said coil forming elements is one of 2 and 3.

5. A magnetic field sensor according to claim 4, characterized in that of said coil forming elements, with reference to said substrate, one of said coil forming element which corresponds to a lowermost layer and said coil forming element which corresponds to an uppermost layer continues to said one grounding layer, and the remaining one continues to said strip conductor.

6. A magnetic field sensor according to claim 4, characterized in that
   said one grounding layer and said coil forming element which continues thereto are formed of one conductor layer, and
   said strip conductor and said coil forming element which continues thereto are formed of another conductor layer.

7. A magnetic field sensor according to claim 1, characterized in that the total number of said coil forming elements is 4.

8. A magnetic field sensor according to claim 7, characterized in that
   of said coil forming elements, with reference to said substrate, one of said coil forming element which corresponds to a lowermost layer and said coil forming element which corresponds to an uppermost layer continues to said one grounding layer,
   extending means which continues to said strip conductor is formed close to one of said three remaining coil forming elements which is located at the middle, and
   the remaining one of said coil forming element which corresponds to said lowermost layer and said coil forming element which corresponds to said uppermost layer is in contact with said extending means through a via hole.

9. A magnetic field sensor according to claim 1, characterized in that each of said lower grounding layer and said upper grounding layer comprises a T-shaped planar shape in which a line width at an end on a stacked coil side is larger than a line width at another region to form a rectangular region.

10. A magnetic field sensor according to claim 9, characterized in that said strip conductor extends through a middle point of a long side on a proximal portion side of said rectangular region and a central point of said rectangular region, switches a direction thereof by 90° at the central point to extend along a central line which extends through a middle point of a short side of said rectangular region, switches a direction thereof again by 90° toward said stacked coil before reaching said short side, and reaches a long side on a stacked coil side of said rectangular region.

11. A magnetic field sensor according to claim 9, characterized in that a length of a short side of said rectangular region is 4 to 8 times a line width of said strip conductor.

12. A magnetic field sensor according to claim 11, characterized in that a gap between an end of said strip conductor on said stacked coil side and a short side among short sides of said rectangular region which is the closest to said end is not less than twice the line width of said strip conductor.

13. A magnetic field sensor according to claim 1, characterized in that each of said lower grounding layer and said upper grounding layer comprises a band-like planar shape.

14. A magnetic field sensor according to claim 1, characterized in that a thickness of said upper interlayer dielectric film on said strip conductor is substantially equal to that of said lower interlayer dielectric film under said strip conductor.

15. A magnetic field sensor according to claim 1, characterized in that said strip line comprises a shield type strip line region with an outer surface which is formed of said lower grounding layer and said upper grounding layer.

16. A magnetic field sensor according to claim 1, characterized in that a characteristic impedance of said strip line is equal to that of a high-frequency cable which connects to one end of said strip line.

17. A magnetic field sensor according to claim 1, characterized in that a characteristic impedance of said strip line is equal to that of a transmission line that relays said strip line to a high-frequency cable.

18. A magnetic field sensor according to claim 1, characterized in that all said coil forming elements are wound in one direction.

* * * * *